(12) United States Patent
Alford et al.

(10) Patent No.: US 6,965,515 B2
(45) Date of Patent: Nov. 15, 2005

(54) THERMOELECTRIC COOLING OF LOW-NOISE AMPLIFIER TRANSISTORS IN WIRELESS COMMUNICATIONS NETWORKS

(75) Inventors: James L. Alford, Somerset, NJ (US); Mike Thomas, Hermosa Beach, CA (US)

(73) Assignee: Andrew Corporation, Orland Park, IL (US)

( * ) Notice: Subject to any disclaimer, the term of this patent is extended or adjusted under 35 U.S.C. 154(b) by 245 days.

(21) Appl. No.: 10/645,075

(22) Filed: Aug. 21, 2003

(65) Prior Publication Data

US 2005/0041397 A1    Feb. 24, 2005

(51) Int. Cl.$^7$ .............................. H05K 7/20; H03F 1/26
(52) U.S. Cl. ..................... 361/709; 361/712; 361/722; 257/712; 455/254; 165/253; 62/3.2; 62/259.2
(58) Field of Search ................................ 361/702, 709, 361/712–717, 719–724; 257/712, 930; 330/265, 330/277; 62/3.2, 3.6, 259.2; 359/341.1, 341.4, 359/337; 455/254, 141, 15, 561; 165/253; 136/203; 333/99 S, 99 R; 343/890, 891

(56) References Cited

U.S. PATENT DOCUMENTS

| | | | |
|---|---|---|---|
| 4,625,328 A | 11/1986 | Freadman | 381/111 |
| 5,014,181 A | 5/1991 | Anderson et al. | 363/126 |
| 5,157,352 A | 10/1992 | Chickanosky, Jr. et al. | 330/289 |
| D340,972 S | 11/1993 | Johnson, III et al. | D23/351 |
| 5,604,925 A * | 2/1997 | O'Malley et al. | 455/254 |
| 5,655,375 A | 8/1997 | Ju | 62/3.6 |
| 5,901,037 A | 5/1999 | Hamilton et al. | 361/699 |
| 5,934,079 A * | 8/1999 | Han et al. | 62/3.2 |
| 5,946,188 A | 8/1999 | Rochel et al. | 361/690 |
| 6,039,471 A * | 3/2000 | Wyland | 374/43 |
| 6,052,559 A | 4/2000 | Buer et al. | 455/12.1 |
| 6,130,902 A * | 10/2000 | Shimoji | 372/34 |
| 6,134,110 A | 10/2000 | Langari | 361/700 |
| 6,212,404 B1 * | 4/2001 | Hershtig | 455/561 |
| 6,298,670 B1 | 10/2001 | Pundak | 62/6 |
| 6,345,507 B1 * | 2/2002 | Gillen | 62/3.7 |
| 6,404,631 B1 | 6/2002 | Lee et al. | 361/699 |
| 6,522,459 B1 * | 2/2003 | Pease et al. | 359/341.4 |

FOREIGN PATENT DOCUMENTS

| | | | | |
|---|---|---|---|---|
| JP | 59218011 A | * | 12/1984 | H03F 1/26 |
| JP | 60139008 A | * | 7/1985 | H03F 3/19 |
| JP | 61023346 A | * | 1/1986 | H01L 23/12 |

* cited by examiner

Primary Examiner—Michael Datskovskiy
(74) Attorney, Agent, or Firm—Wood, Herron & Evans, L.L.P.

(57) ABSTRACT

A base station for a wireless communications system having a tower-mounted amplifier system with a low-noise amplifier transistor and a thermoelectric cooler that reduces the operating temperature of the low-noise amplifier transistor. The amplifier system has additional heat-generating components, such as filters, and additional electrical components mounted on a substrate to which the low-noise amplifier transistor is mounted. These heat-generating components are thermally isolated from the cold side of the thermoelectric cooler. As a result, the cooling capacity and electrical power requirement for the thermoelectric cooler is significantly reduced because only the low-noise amplifier transistor is cooled.

20 Claims, 2 Drawing Sheets

THERMOELECTRIC COOLING OF LOW-NOISE AMPLIFIER TRANSISTORS IN WIRELESS COMMUNICATIONS NETWORKS

FIELD OF THE INVENTION

This invention relates generally to wireless communications networks and, in particular, to reducing the operating temperature of low-noise amplifier transistors used in wireless communications networks.

BACKGROUND OF THE INVENTION

Wireless communication networks divide a coverage area into multiple cells each arranged to communicate with mobile stations (e.g., mobile phones) with minimal interference between the cells. A mobile station crossing the coverage area has its communications handed-off between adjacent cells. Each of the multiple cells is typically served by a base station having a transceiver that communicates with the mobile station via an antenna situated on a tower.

Tower-mounted amplifiers (TMA's) used with the base station antenna improve the sensitivity of base station with respect to amplifier systems located at the base of the tower. Signals received by the antenna are amplified by the TMA before being transmitted over a transmission line to a radio of the base station. As a result, the signal-to-noise ratio of the signal communicated to the radio is preserved as the line losses reduce the level of the amplified signal transmitted to the radio. Preserving the signal-to-noise ratio also reduces the number of base stations required to cover a given coverage area by extending their range.

To optimize sensitivity and improve performance of the TMA, it is desirable that its low-noise amplifier transistor have a minimized noise figure. A conventional approach for enhancing the performance of heat-sensitive electronic equipment, such as low-noise amplifier transistors, is to cool the components of the equipment using a thermoelectric cooler. Thermoelectric coolers constitute solid state heat pumps that may be used to extract heat from electronic equipment. Often, a thermoelectric cooler includes a cold side that is placed in heat transfer communication with the chassis or housing of a complete electronic device, a hot side from which transferred heat is dissipated, and a thermoelectric module that transfers heat from the cold side to the hot side.

This conventional approach for reducing the operating temperature of electronic devices suffers from certain deficiencies. In many conventional arrangements, the thermoelectric cooler must cool an enclosure housing the electronic device and various heat-generating components inside the enclosure. For example, a TMA incorporates heat-generating components, such as filters, in addition to the low-noise amplifier transistor of the TMA. As a result, the cooling capacity of the thermoelectric cooler must accommodate heat generated by components of the TMA in addition to the heat generated by the low-noise amplifier transistor. Increasing the required cooling capacity of the thermoelectric cooler increases its cost and also increases the electrical power required to operate the thermoelectric cooler. Moreover, a ventilation fan may be required to convectively cool a heat sink thermally coupled with the hot side of the thermoelectric cooler.

Therefore, it would be desirable, among other things, to address cooling issues associates with TMAs and to reduce the cooling capacity of a thermoelectric cooler used to reduce the operating temperature of low-noise amplifier transistors used in wireless communications networks.

DETAILED DESCRIPTION OF THE INVENTION

Figure 1:
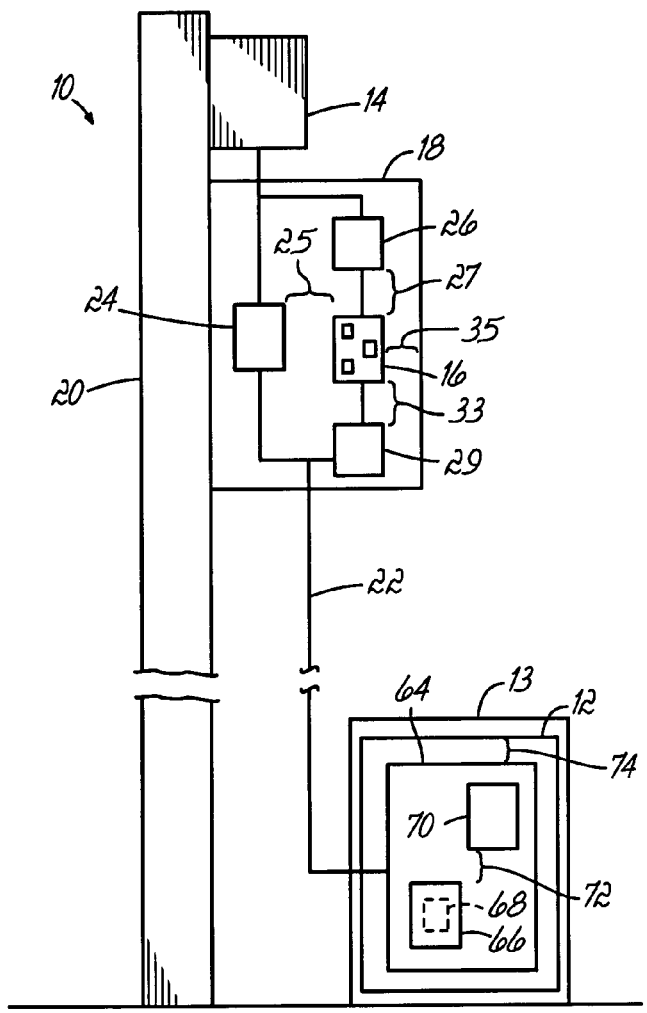
FIG. 1 is a diagrammatic view depicting the connection between a base station and a tower-mounted amplifier system in accordance with the principles of the invention.

With reference to FIG. 1, a base station, generally indicated by reference numeral 10, of a wireless communications system often includes a transceiver radio 12 housed inside a ground-level shelter 13, an antenna 14, and a tower-mounted amplifier module 16 enclosed inside of a tower housing 18. The antenna 14 and tower-mounted amplifier module 16 are each mounted to a tower 20 or other support structure, such as a building. A transmission link 22, such as a transmission line or wireless link, couples the tower-mounted amplifier 16 to the radio 12 for electrically coupling tower-mounted amplifier module 16 with radio 12. Also provided inside the tower housing 18 are diplexing filters 24, 26, 29 effective for reducing out of band interference and to enable sharing of the antenna 14 and transmission link 22 for both transmitted and received signals transferred between the radio 12 and the antenna 14. Collectively, the filters 24, 26, 29 may function as a dual diplexer. Tower housing 18 is typically formed of a material having a high thermal conductivity, such as a metal.

The antenna 14 contains radiating elements of any type suitable for use in a wireless communication network. Suitable radiating elements for antenna 14 include, but are not limited to, monopole elements, dipole elements, loops, slots, spirals or helices, horns, and microstrip patches.

Figure 2:
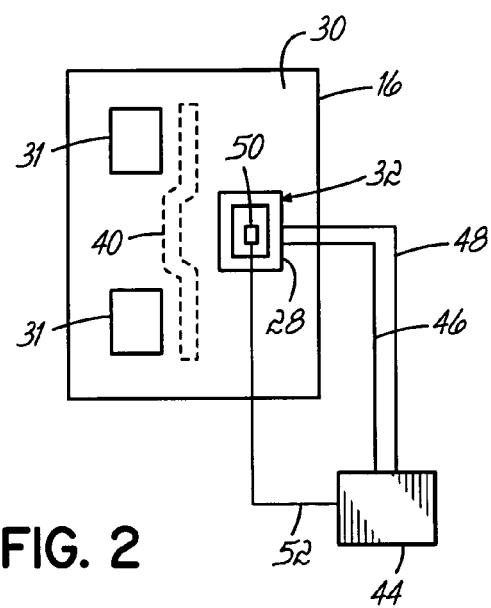
FIG. 2 is a diagrammatic view of a portion of the tower-mounted amplifier system of FIG. 1.

With reference to FIGS. 1 and 2, the tower-mounted amplifier module 16 includes a low-noise amplifier transistor 28 disposed on a substrate 30, such as a printed circuit board. The low-noise amplifier transistor 28 may have a single, duplex or dual duplex configuration as understood by persons of ordinary skill in the art. One exemplary low-noise amplifier PHEMT transistor suitable for use as low-noise amplifier transistor 28 consistent with the invention is the Model ATF-54143 FET transistor available from Agilent Technologies (Palo Alto, Calif.), which has a 0.5 dB noise figure and a 16.6 dB associated gain. The side of the substrate 30 to which the low-noise amplifier transistor 28 is mounted is generally constructed from a material having a relatively low thermal conductivity and is not an efficient in-plane conductor of heat. For example, a printed circuit board is typically a layered composite consisting of a thin copper foil ground plane and a significantly thicker, glass-reinforced polymer, such as the epoxy-based organic FR-4 having a thermal conductivity of about 0.25 W/mK.

Substrate 30 includes a plurality of, for example, two electrical components 31 and various electrically conductive paths (not shown), as understood by a person of ordinary skill in the art, required for operation of the amplifier module 16. During operation, the active elements of the low-noise amplifier 28 and the electrical components 31 generate heat and present individual heat loads. The low-noise amplifier transistor 28 and the electrical components 31 are often encapsulated inside a surface-mount package formed from a thermoplastic resin.

Figure 3:
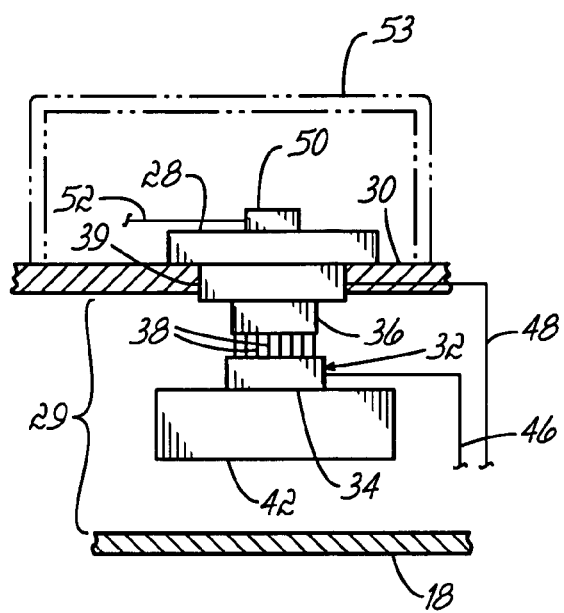
FIG. 3 is a side view of the low-noise amplifier transistor and the thermoelectric cooler of FIG. 2.

In accordance with the principles of the invention and with reference to FIGS. 2 and 3, the tower-mounted amplifier module 16 includes a thermoelectric cooler 32 that extracts or withdraws heat from the low-noise amplifier transistor 28. The thermoelectric cooler 32 includes a lower support plate 34 and an upper support plate 36 between which multiple thermoelectric elements 38 are disposed. The thermoelectric elements 38 consist of an array of dissimilar n-type and p-type semiconductors thermally joined in parallel and electrically joined in series at both ends to form a couple. The thermoelectric cooler 32, which operates by the Peltier effect, converts electrical energy to heat pumping energy.

Direct-current power applied across the lower and upper support plates 34, 36 induces heat flow from the upper support plate 36 through the thermoelectric elements 38 to the lower support plate 34 as the thermoelectric elements 38 convert electrical energy to heat pumping energy. As heat is continuously transferred, the upper support plate 36 defines a cold side and the lower support plate 34 defines a hot side. The upper support plate 36 is in thermal contact or heat transfer communication with the low-noise amplifier transistor 28. To that end, a thermally conductive element 39 is provided in the substrate 30 between the thermoelectric cooler 32 and the low-noise amplifier transistor 28. In one embodiment, the thermally conductive element 39 may be a plurality of thermal vias extending through substrate 30 and formed of a material having a high thermal conductivity, such as copper having a room temperature thermal conductivity of about 400 W/mK. Alternatively, the thermally conductive element 39 may be provided as an insert positioned in a cut-out in the substrate 30 and formed from a ceramic, such as alumina having a room temperature thermal conductivity of about 18 W/mK, aluminum nitride (about 200 W/mK), or beryllium oxide (about 300 W/mK), or a metal, such as copper (about 400 W/mK).

The upper support plate 36 absorbs heat generated by the active devices of the low-noise amplifier transistor 28. Because the upper support plate 36 is in thermal contact only with the low-noise amplifier transistor 28, the cooling capacity of the thermoelectric cooler 32 is reduced when compared with conventional tower-mounted amplifiers in which a thermoelectric cooler cools the tower housing, the filters, and other heat generating elements inside the tower housing in addition to the low-noise amplifier transistor 28. The transferred heat is dissipated from the lower support plate 34 to the surrounding environment. The lower support plate 34 includes a heat sink 42 to increase the heat dissipation efficiency by maintaining the temperature of the lower support plate 34 as low as possible. The heat sink 42 may be any conventional structure, such as a heat spreader, a cold plate, or a convective fin stack, or the tower housing 18 of the electronic device.

With continued reference to FIGS. 2 and 3, the substrate 30 has a low thermal conductivity so that little heat is transferred through substrate 30 from the electrical components 31 or the tower housing 18 to the thermoelectric cooler 32. In an alternative embodiment, the substrate 30 may incorporate a thermal insulator 40 that assists in thermally insulating the thermoelectric cooler 32 against heat generated by the electrical components 31. Specifically, the thermal insulator 40 represents a discontinuity in a heat flow path from electrical components 31 to the upper support plate 36 of the thermoelectric cooler 32. The thermal insulator 40 is any material having a lesser thermal conductivity than substrate 30. In one embodiment of the invention, the heat insulator 40 is an air gap, which disrupts conductive pathways to the upper support plate 36, as air is an effective thermal insulator.

The filters 24, 26, 29 are separated from the substrate 30 by respective air gaps 25, 27, 33, each of which operates as an effective thermal insulator eliminating pathways for heat conduction to the upper support plate 36. As a result, heat generated by the filters 24, 26, 29 cannot flow to the low-noise amplifier transistor 28 and, therefore, is not extracted by thermoelectric cooler 32. Air gaps 25, 27 33 are each understood to be a separation between any two points of the corresponding one of filters 24, 26, 29 and the substrate 28, which are three-dimensional objects. Moreover, the upper support plate 36 of the thermoelectric cooler 32 is thermally isolated from the tower housing 18 by substrate 30 and also by an air gap 35 separating tower housing 18 from substrate 30 and upper support plate 36 so that heat is not transferred from the tower housing 18 to the upper support plate 36. Air gap 35 is understood to extend about all confronting surfaces of the tower housing 18 and substrate 30, which are three-dimensional objects. In certain embodiments of the invention, the air gap 35 may be absent so that the thermal insulation is provided exclusively by the substrate 30. It follows that, due to the thermal insulation against heat transfer, the thermoelectric cooler 32 does not have to dissipate heat or, at the least, a significant heat load, transferred from filters 24, 26, 29 or tower housing 18.

With continued reference to FIGS. 2 and 3, a tower-mounted controller/power supply 44 supplies operating power to the thermoelectric cooler 32 over cables 46, 48 and may also be positioned inside of the tower housing 18. The thermoelectric cooler 32 and controller/power supply 44 may be packaged in a single chip device. A temperature sensor 50, such as a thermistor or platinum resistance temperature detector, monitors the temperature of low-noise amplifier transistor 28 and/or thermoelectric cooler 32 and provides information characterizing the temperature via a cable 52 to the controller/power supply 44. The heat transfer rate of the thermoelectric cooler 32 is adjusted by controlling the power supplied by controller/power supply 44 to the upper and lower support plates 34, 36. In this way, feedback control can be accomplished so that the temperature of the low-noise amplifier transistor 28 can be adjusted to, and maintained at, a desired operating temperature.

An exemplary thermoelectric cooler suitable for use in the invention is the Model SP5060 thermoelectric cooler commercially available from Marlow Industries Inc. (Dallas, Tex.), which is capable of providing a maximum temperature drop for an unloaded state of 68.5° C.-dry $N_2$ from the cold side to the hot side with the hot side at a temperature of 27° C. and a maximum temperature drop for an unloaded state of 88.5° C.-dry $N_2$ from the cold side to the hot side with the hot side at a temperature of 85° C.

A cover 53 of a material having a low thermal conductivity may be positioned on the substrate 30 so as to enclose the low-noise amplifier transistor 28. The cover 53 reduces heat transferred from the ambient atmosphere inside the tower housing 18 to the low-noise amplifier transistor 28 and, therefore, to the upper support plate 36 of the thermoelectric cooler 32. The thermal insulation provided by the cover 53 significantly reduces the heat load that must be dissipated by the thermoelectric cooler 32, as the ambient atmosphere inside the tower housing 18 may be heated when deployed on tower 20 and during operation.

In use, the thermoelectric cooler 32 is energized by power supplied by the tower-mounted controller/power supply 44, which causes heat transfer or heat flow from the upper support plate 36 through the thermoelectric elements 38 to the lower support plate 34 and reduces the temperature of the upper support plate 36. A temperature gradient exists between the lower and upper support plates 34, 36 that increases in a direction from the upper support plate 36 to the lower support plate 34. The low-noise amplifier transistor 28 of the tower-mounted amplifier module 16 presents a heat load during operation. Heat is transferred from the low-noise amplifier transistor 28 through the thermally conductive element 39 to the upper support plate 36, which reduces the operating temperature of the low-noise amplifier transistor 28. The temperature sensor 50 provides temperature information to the controller/power supply 44, which in turn regulates the operating power delivered to the thermoelectric cooler 32 for maintaining the low-noise amplifier transistor 28 at a constant operating temperature that is significantly less than the ambient temperature of the surrounding environment.

The tower housing 18, filters 24, 26, 29 and electrical components 31 are not cooled by the thermoelectric cooler 32. In particular, cooling the filters 24, 26, 29 and the electrical components 31 is not necessary because the heat generated by the filters 24, 26, 29 and electrical components 31 does not produce as much temperature-dependent noise and, therefore, do not significantly contribute to degrading the signal-to-noise ratio of the signal transmitted from the antenna 14 to the radio 12.

Figure 4:
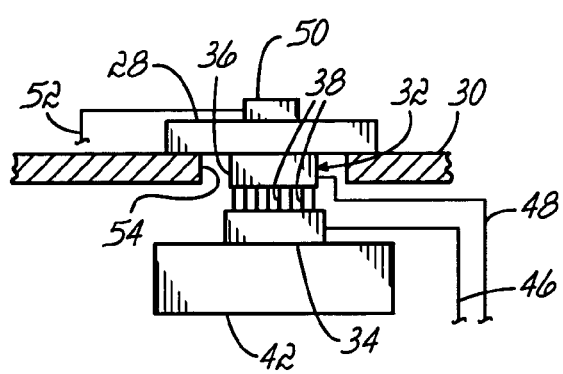
FIG. 4 is a side view similar to FIG. 3 of an alternative embodiment in accordance with the principles of the invention.

With reference to FIG. 4 in which like reference numerals refer to like features in FIG. 3 and in accordance with an alternative embodiment of the invention, an opening 54 is provided in the substrate 30. Opening 54 is dimensioned such that upper support plate 36 may be placed into direct contact with the low-noise amplifier transistor 28 without any intervening thermally conductive element 39 (FIG. 3).

Figure 5:
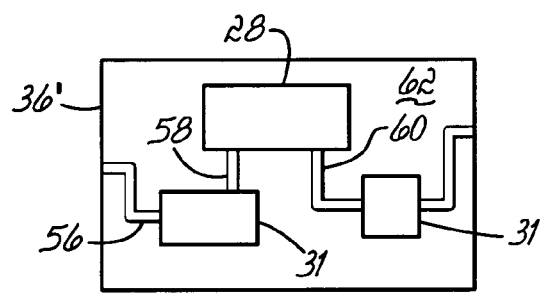
FIG. 5 is a side view similar to FIG. 3 of another alternative embodiment in accordance with the principles of the invention.

With reference to FIG. 5 in which like reference numerals refer to like features in FIG. 3 and in accordance with an alternative embodiment of the invention, upper support plate 36' is patterned with metallization traces 56, 58 and 60 electrically coupling the low-noise amplifier transistor 28 and the electrical components 31 with one another and the antenna 14, transmission link 22, and the filters 24, 26, 29 (FIG. 1). Thereby, the substrate 30 (FIG. 2) may be reduced in size or eliminated in its entirety. The metallization traces 56, 58 and 60 are surrounded by a non-conductive portion 62 of the upper support plate 36'.

With renewed reference to FIG. 1, the transceiver radio 12 is mounted inside ground-level shelter 13, which operates as a support structure, and houses a substrate 64, similar to substrate 30. A power amplifier transistor 66 mounted to the substrate 64 generates heat when energized and operating. In accordance with the principles of the invention, the operating temperature of the power amplifier transistor 66 may be reduced by a operation of a thermoelectric cooler 68, as described herein with regard to low-noise amplifier transistor 28 and thermoelectric cooler 32. Heat generated from an adjacent electronic component 70 of the transceiver radio 12 is not transferred to the thermoelectric cooler 68. For example, electronic component 70 may be separated from the power amplifier transistor 66 and the thermoelectric cooler 68 by an air gap 72 that limits heat transfer. Alternatively, the substrate 64 may be formed from a material characterized by a relatively low thermal conductivity. Therefore, the thermoelectric cooler 68 is thermally insulated from electronic component 68 but effectively cools the power amplifier transistor 66. The thermoelectric cooler 68 has an upper support plate or cold side (not shown but similar to upper support plate 36 of thermoelectric cooler 32) that may be coupled in heat transfer communication with power amplifier transistor 66 by a thermally conductive element (not shown but similar to thermally conductive element 39) or directly coupled in heat transfer communication with the power amplifier transistor 66, as described herein with regard to low-noise amplifier transistor 28. The transceiver radio 12 constitutes a housing that is thermally insulated from the cold side by a heat insulator, such as an air gap 74 and/or the substrate 64 of lower thermal conductivity.

In accordance with the principles of the invention, cooling the low-noise amplifier transistor of the tower-mounted amplifier module reduces the noise figure and concomitantly increases the sensitivity of the low-noise amplifier transistor. The thermoelectric cooler cools the active devices of the low-noise amplifier transistor without the necessity of any moving components so as to increase reliability of the cooling process and to decrease the cost of operation. In one aspect, a ventilation fan not is required, as is conventional, to provide a flow of air for convective cooling of the hot side of the thermoelectric cooler.

In addition, the cooling capacity and electrical power requirement for the thermoelectric cooler is significantly reduced because only the low-noise amplifier transistor is cooled so as to decrease the thermal load that must be dissipated by the thermoelectric cooler. Nonetheless, cooling only the low-noise amplifier transistor active devices is adequate for effectively reducing the noise figure of the tower-mounted amplifier module as electrical components on the substrate carrying the low-noise amplifier transistor and filters and the like of the tower-mounted amplifier system do not significantly degrade the system signal-to-noise ratio. In one particular embodiment, the thermoelectric cooler is effective to reduce the noise figure of the low-noise amplifier transistor by about 0.5 dB, which reduces the number of base stations required to service a coverage area.

Alternatively, cooling only the low-noise amplifier transistor to reduce the noise figure permits the selection of a low-noise amplifier transistor having a larger room temperature noise figure and a smaller filter having a greater loss. This would effectively reduce the cost of the low-noise amplifier transistor as the specifications therefore would be less stringent.

While the present invention has been illustrated by a description of various preferred embodiments and while these embodiments have been described in considerable detail in order to describe the best mode of practicing the invention, it is not the intention of the applicants to restrict or in any way limit the scope of the appended claims to such detail. Additional advantages and modifications within the spirit and scope of the invention will readily appear to those skilled in the art. The invention itself should only be defined by the appended claims, Wherein we claim:

1. An amplifier module for attachment to a support structure of a base station in a wireless communications network, the module comprising:
   a substrate;
   a heat-generating electrical component coupled to said substrate;

a low-noise amplifier transistor coupled to said substrate and capable of generating heat; and a thermoelectric cooler positioned proximate said substrate, said thermoelectric cooler having a cold side thermally coupled with said low-noise amplifier transistor, said cold side being cooled for extracting heat from said low-noise amplifier transistor, and said cold side being thermally isolated from said electrical component.

2. The amplifier module of claim 1 further comprising:
a heat-generating filter thermally isolated from said cold side by a heat insulator.

3. The amplifier module of claim 2 wherein said heat insulator is an air gap.

4. The amplifier module of claim 1 wherein said substrate further comprises:
a heat insulator separating said electrical component from said cold side.

5. The amplifier module of claim 4 wherein said substrate is formed from a material having a low thermal conductivity, and said heat insulator is a portion of said substrate separating said electrical component from said cold side.

6. The base station of claim 4 wherein said heat insulator is an air gap provided in said substrate between said electrical component and said cold side.

7. The amplifier module of claim 1 wherein said substrate further comprises:
a thermally conductive element coupling said cold side in heat transfer communication with said low-noise amplifier transistor.

8. The amplifier module of claim 1 wherein said cold side is directly coupled in heat transfer communication with said low-noise amplifier transistor.

9. The amplifier module of claim 1 further comprising a housing enclosing said substrate, said housing being thermally isolated from said cold side.

10. The amplifier module of claim 9 further comprising:
a heat insulator separating said housing from said cold side.

11. The amplifier module of claim 10 wherein said heat insulator is an air gap between said housing and said cold side.

12. An amplifier module for attachment to a support structure for a base station in a wireless communications network, the module comprising:
a housing capable of being mounted to said support structure; said;
a low-noise amplifier transistor positioned inside said housing and capable of generating heat; and
a thermoelectric cooler positioned inside said housing, said thermoelectric cooler having a cold side thermally coupled with said low-noise amplifier transistor, said cold side being cooled for extracting heat from said low-noise amplifier transistor, and said cold side being thermally isolated from said housing.

13. The amplifier module of claim 12 wherein further comprising a heat insulator separating said housing from said cold side.

14. The amplifier module of claim 13 wherein said heat insulator is an air gap between said housing and said cold side.

15. A transceiver radio for a base station of a wireless communications network, comprising:
a substrate;
a power amplifier transistor coupled to said substrate and capable of generating heat;
a heat-generating electrical component coupled to said substrate; and
a thermoelectric cooler positioned proximate said substrate, said thermoelectric cooler having a cold side thermally coupled with said power amplifier transistor, said cold side being cooled for extracting heat from said power amplifier transistor, and said cold side being thermally isolated from said electrical component.

16. The transceiver radio of claim 15 wherein said substrate further comprises:
a heat insulator separating said electrical component from said cold side.

17. The transceiver radio of claim 16 wherein said substrate is formed from a material having a low thermal conductivity, and said heat insulator is a portion of said substrate separating said electrical component from said cold side.

18. The transceiver radio of claim 16 wherein said heat insulator is an air gap provided in said substrate between said electrical component and said cold side.

19. The transceiver radio of claim 15 wherein said substrate further comprises:
a thermally conductive element coupling said cold side in heat transfer communication with said power amplifier transistor.

20. The transceiver radio of claim 15 wherein said cold side is directly coupled in heat transfer communication with said power amplifier transistor.

* * * * *

UNITED STATES PATENT AND TRADEMARK OFFICE
CERTIFICATE OF CORRECTION

| | | |
|---|---|---|
| PATENT NO. | : 6,965,515 B2 | Page 1 of 2 |
| APPLICATION NO. | : 10/645075 | |
| DATED | : November 15, 2005 | |
| INVENTOR(S) | : James L. Alford and Mike Thomas | |

It is certified that error appears in the above-identified patent and that said Letters Patent is hereby corrected as shown below:

On Title Page
    Item 57 Page 1, ABSTRACT, Column 2, reads "...requirement for the thermoelectric cooler is significantly..." and should read -- ...requirement for the thermoelectric cooler are significantly... --.

Column 1, line 66 reads "...address cooling issues associates with TMAs and to reduce..." and should read -- ...address cooling issues associated with TMAs and to reduce... --.

Column 4, line 17 reads "...extracted by thermoelectric cooler 32. Air gaps 25, 27 33 are..." and should read -- ...extracted by thermoelectric cooler 32. Air gaps 25, 27, 33 are... --.

Column 5, line 32 reads "...and, therefore, do not significantly contribute to degrading..." and should read -- ...and, therefore, does not significantly contribute to degrading... --.

Column 6, line 26 reads "...aspect, a ventilation fan not is required, as is conventional,..." and should read -- ...aspect, a ventilation fan is not required, as is conventional,... --.

Column 6, line 30 reads "...requirement for the thermoelectric cooler is significantly ..." and should read -- ...requirement for the thermoelectric cooler are significantly ... --.

Column 7, CLAIM 12, lines 46-47 read "a housing capable of being mounted to said support structure; said; ..." and should read -- a housing capable of being mounted to said support structure; ... --.

UNITED STATES PATENT AND TRADEMARK OFFICE
CERTIFICATE OF CORRECTION

PATENT NO. : 6,965,515 B2
APPLICATION NO. : 10/645075
DATED : November 15, 2005
INVENTOR(S) : James L. Alford and Mike Thomas It is certified that error appears in the above-identified patent and that said Letters Patent is hereby corrected as shown below:

Column 8, CLAIM 13, line 7 reads "13. The amplifier module of claim 12 wherein further…" and should read -- 13. The amplifier module of claim 12 further… --.

Signed and Sealed this

Twenty-fifth Day of March, 2008

JON W. DUDAS
*Director of the United States Patent and Trademark Office*